United States Patent
Gallagher et al.

(10) Patent No.: US 8,115,493 B2
(45) Date of Patent: Feb. 14, 2012

(54) TRAINLINE INTEGRITY LOCOMOTIVE TEST DEVICE

(75) Inventors: Brian Gallagher, Watertown, NY (US); Bryan M. McLaughlin, Watertown, NY (US); Michael L. Parisian, Dexter, NY (US); Anthony Lumbis, Watertown, NY (US); Gary Newton, Adams, NY (US)

(73) Assignee: New York Air Brake Corporation, Watertown, NY (US)

( * ) Notice: Subject to any disclaimer, the term of this patent is extended or adjusted under 35 U.S.C. 154(b) by 597 days.

(21) Appl. No.: 12/244,254

(22) Filed: Oct. 2, 2008

(65) Prior Publication Data

US 2010/0085058 A1    Apr. 8, 2010

(51) Int. Cl.
*G01R 31/00* (2006.01)
*B61K 7/12* (2006.01)

(52) U.S. Cl. .................................. 324/503; 246/182 A
(58) Field of Classification Search .................. 324/503; 246/182 A See application file for complete search history.

(56) References Cited

U.S. PATENT DOCUMENTS

| | | | |
|---|---|---|---|
| 4,892,204 A | 1/1990 | Lumbis | |
| 5,659,204 A * | 8/1997 | Miller et al. | 290/9 |
| 5,673,876 A | 10/1997 | Lumbis et al. | |
| 5,769,364 A * | 6/1998 | Cipollone | 246/34 B |
| 5,907,193 A | 5/1999 | Lumbis | |
| 6,225,919 B1 * | 5/2001 | Lumbis et al. | 340/933 |
| 6,624,537 B2 * | 9/2003 | Westlake | 307/125 |
| 6,759,971 B2 | 7/2004 | Lumbis et al. | |
| 6,979,061 B1 | 12/2005 | Lumbis et al. | |
| 7,240,970 B2 * | 7/2007 | Reynolds et al. | 303/7 |
| 7,268,565 B2 * | 9/2007 | Anderson | 324/713 |
| 2008/0149781 A1 | 6/2008 | Root et al. | |

* cited by examiner

*Primary Examiner* — Jeff Natalini
(74) *Attorney, Agent, or Firm* — Barnes & Thornburg LLP (57) ABSTRACT

A trainline integrity locomotive test device is provided that is configured to provide conventionally provided End-Of-Train (EOT) functionality required for a single locomotive test as well as functionality necessary for troubleshooting electrical problems in trainline electrical conductors, wherein the trainline integrity locomotive test device includes a reduced number of components in comparison with a conventional EOT device. Additionally, the test device is provided in more compact, durable and robust form relative to conventional EOT devices. As part of the transmission of trainline integrity data from the test device to the Head-End-Unit, a communications heartbeat signal is substituted for brake pipe pressure conventionally detected by EOT devices, so as to provide an indication of data communication reliability.

19 Claims, 6 Drawing Sheets

TRAINLINE INTEGRITY LOCOMOTIVE TEST DEVICE

The present invention relates generally to electronically controlled pneumatic (ECP) brake systems on trains and, more specifically, to a test assembly for ECP brake devices, as specified in the independent claims.

BACKGROUND OF THE INVENTION AND SUMMARY

The present invention relates generally to maintenance equipment associated with train control and more specifically to a trainline integrity locomotive test assembly which integrates existing train control systems.

Whether a railroad is conducting a single locomotive test, or troubleshooting a short or open circuit somewhere along trainline conductors, conventional test procedures and techniques involve the use of conventionally known End-of-Train (EOT) device. As part of train operation, such conventional EOT devices are placed in the coupler of a last car of a train, and are configured to provide measured brake pipe pressure and measured trainline voltage back to a Head-End-Unit (HEU) of the train, through either the trainline wires or a data radio.

ECP brake systems on trains utilize the HEU, which is connected to a trainline to transmit power and control signals to the electro pneumatic brake devices on each of the cars. Accordingly, conventional HEUs include software for testing a signal quality on a trainline network. Such a device is described in U.S. Pat. No. 6,759,971, the disclosure of which is incorporated by reference in its entirety. Signals transmitted down the trainline command each node to transmit a calibration signal. Thereby, signal quality is determined based on the receipt of the calibration signal. Through the use of such EOTs, various system requirements, such as trainline integrity, communications validation, and trainline brake control may all be established, monitored and maintained.

Such EOT devices have been used conventionally for troubleshooting electrical problems with trainline conductors. Nevertheless, the use of EOT devices for this purpose can be problematic because conventional EOT devices weigh approximately 34 pounds or approximately 15.5 kilograms, and stand approximately three feet or approximately 0.9 meters tall. As a result, positioning and repositioning these EOT devices along the length of a train to trouble shoot electrical problems is both difficult and potentially dangerous. Additionally, such EOT devices are fairly limited because only one EOT device is needed for each train. Therefore, utilizing such EOT devices as a diagnostic tool is not practical. Furthermore, such EOT devices are expensive and their use as off-line; as a result, railroads typically do not have many spares. In the interest of preventing personal injury and property damage, a smaller, light-weight unit has particular utility.

A trainline integrity locomotive test device is provided that is configured to provide conventionally provided EOT device functionality required for a single locomotive test as well as functionality necessary for troubleshooting electrical problems in trainline electrical conductors, wherein the trainline integrity locomotive test device includes a reduced number of components in comparison with a conventional EOT device. As part of the transmission of trainline integrity data from the test device to the HEU, a communications heartbeat signal is substituted for brake pipe pressure conventionally detected by EOT devices, so as to provide an indication of data communication reliability as well as a mechanism for preventing the braking system from operating without an actual EOT device.

In accordance with at least one embodiment, the test device may be configured of solid state components and enclosed in a robust, light-weight, ergonomic enclosure to facilitate portability, increase reliability and improve ease of use.

Other objects, advantages and novel features of the present invention will become apparent from the following detailed description of the invention when considered in conjunction with the accompanying drawings.

BRIEF DESCRIPTION OF THE DRAWINGS

Various embodiments are described herein, by way of example only, with reference to the accompanying drawings. With specific reference now to the drawings, it should be understood that the particulars shown are by way of example and for purposes of discussion of illustrated embodiments only, and are presented in order to provide what is believed to be a useful and readily understood description of the principles and concepts of the invention. In this regard, no attempt is made to show structural details of the invention in more detail than is necessary for a fundamental understanding of the invention, the description taken with the drawings making apparent to those skilled in the art how the several forms of the invention may be embodied in practice.

Accordingly, a more complete understanding of the present invention and the utility thereof may be acquired by referring to the following description in consideration of the accompanying drawings, in which like reference numbers indicate like features, and wherein.

DETAILED DESCRIPTION OF EMBODIMENTS

In the following description of various invention embodiments, reference is made to the accompanying drawings, which form a part hereof, and in which is shown, by way of illustration, various embodiments in which the invention may be practiced. It is to be understood that other embodiments may be utilized and structural and functional modifications may be made without departing from the scope of the present invention.

To better understand the utility of the illustrated embodiments, the following description of conventional EOT devices for ECP trains is provided. As is known conventionally, ECP trains utilize communications network-based, electronic-pneumatic train brake control systems, as explained in U.S. Pub. 20080149781, entitled "End of Train Device for ECP Trains," the disclosure of which is incorporated by reference in its entirety.

ECP train brake control systems typically include locomotive equipment, car specific equipment, an EOT device, and a power/communications distribution system. The locomotive equipment collectively may also be referred to as the Head-End-Unit (HEU) and typically includes a trainline power supply and communications controller, a brake controller and an operator interface unit.

The locomotive HEU supplies power to and communicates with each of the control devices for the cars included in the train via a communication line included in the trainline 105. The EOT device provides termination of the communication line and transmits an EOT message back to the HEU for the purposes of establishing trainline integrity during train operation. Establishing, monitoring and maintaining such trainline integrity is necessary because all trainline power and communications are transmitted on a single set of wires.

Because EOT devices have the functionality to establish and monitor trainline integrity during train operation, such devices have been used conventionally to troubleshoot trainline electrical conductors outside of train operation. However, as mentioned above, the bulky and costly nature of these EOT devices, as well as their limited availability, makes the design and use of an alternative diagnostic device particularly useful.

Thus, in accordance with illustrated embodiments, a Trainline Integrity Locomotive Test Device (TILTD) is provided that is configured to provide EOT device functionality required for a single locomotive test as well as functionality necessary for troubleshooting electrical problems in trainline conductors.

Figure 1:
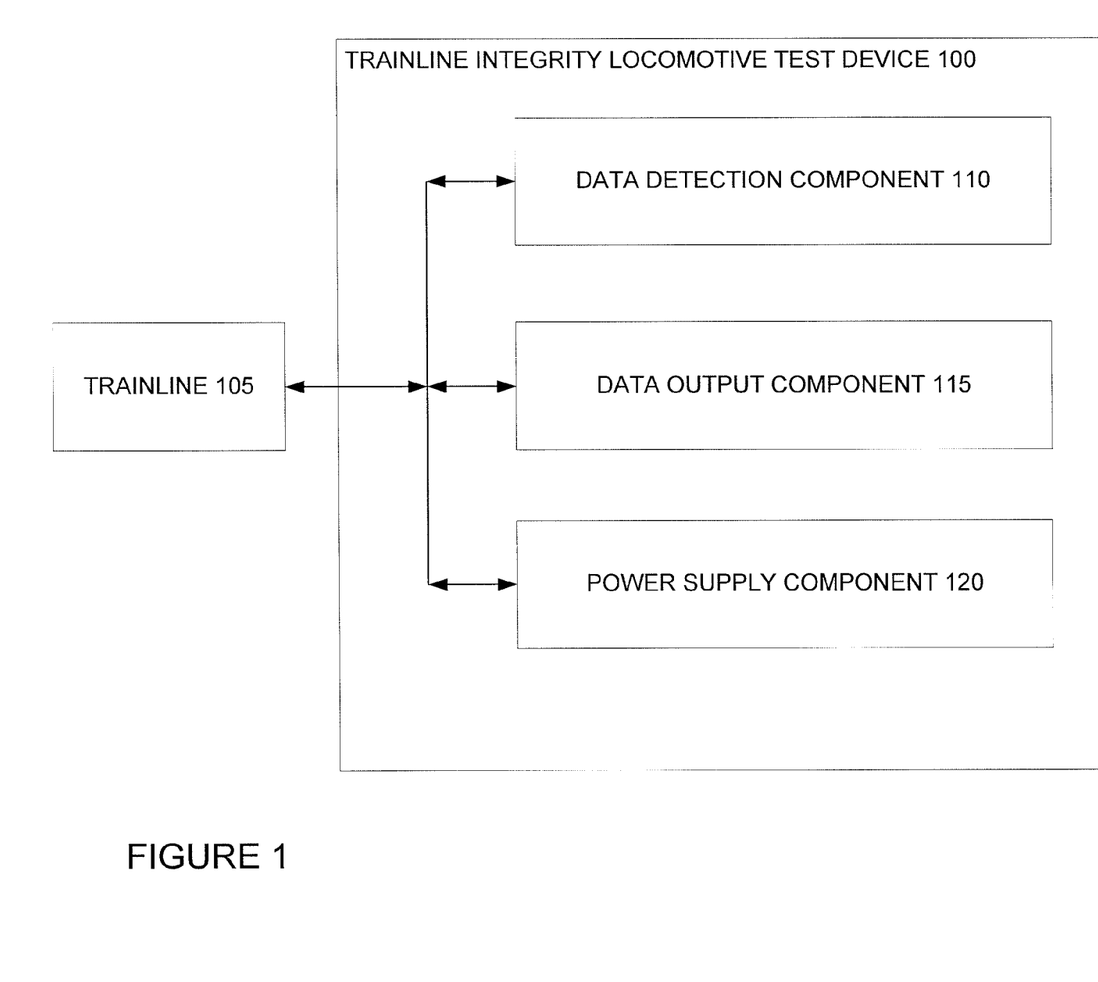
FIG. 1 is a functional block diagram provided to facilitate explanation of an illustrated embodiment of the trainline integrity locomotive test device.

FIG. 1 is a functional block diagram provided to facilitate explanation of an illustrated embodiment of the TILTD. As shown in FIG. 1, the TILTD 100 may be coupled to a trainline 105 for diagnostic purposes such as, for example, troubleshooting electrical problems on trainline conductors. Accordingly, the TILTD 100 may include various components to function as a diagnostic tool. Because the TILTD 100 is testing the trainline 105 functionality the TILTD 100 includes both data detection component 110 and data output component 115. Data is detected based on analysis of the operation of the trainline 105; however, data is also transmitted to the HEU via the trainline 105. Moreover, the TILTD 100 is configured to obtain at least a portion of its operating power via the trainline 105. Accordingly, the data detection component 110, data output component 115 and power supply component 120 are all coupled to the trainline 105 in parallel.

Figure 2:
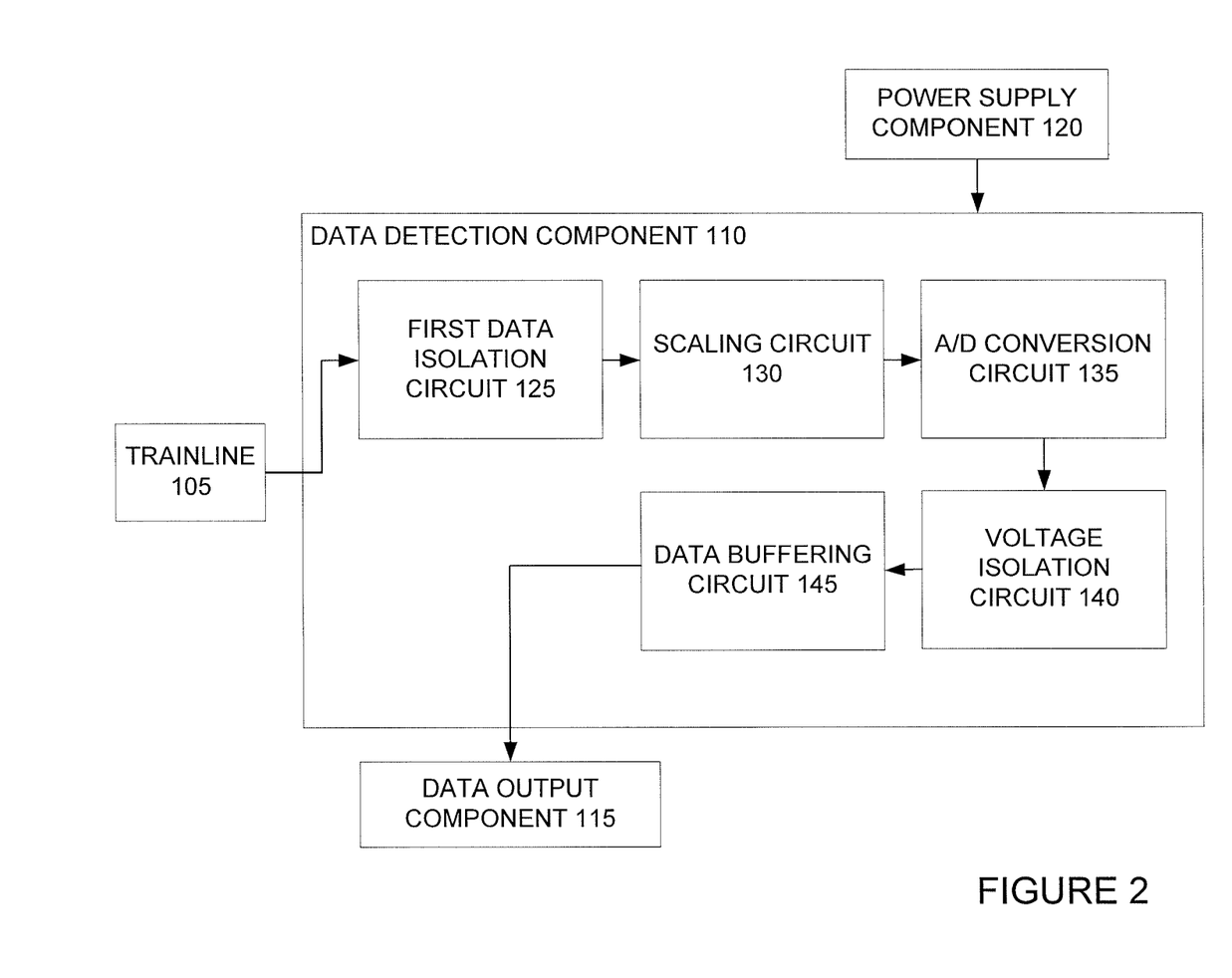
FIG. 2 is a further functional block diagram with additional detail regarding the data detection components and provided to facilitate explanation of an illustrated embodiment of the trainline integrity locomotive test device.

FIG. 2 is a further functional block diagram with additional detail regarding the data detection component and provided to facilitate explanation of an illustrated embodiment of the trainline integrity locomotive test device. As shown in FIG. 2, the data detection component 110 may be coupled to the power supply component 110 so as to receive operating power for the circuits included therein. Additionally, the data detection component 110 may be coupled to the data output component 115 so as to enable transmission of the detected data to the HEU via the trainline.

The data detection component 110 may include, for example, a first data isolation circuit 125 configured to isolate the trainline data, including the trainline analog voltage, from communication data provided on the trainline 105, so that the trainline voltage data may be detected. Following detection and isolation of the analog trainline voltage, the voltage is scaled by the scaling circuit 130 to a level appropriate for analog to digital conversion by the A/D conversion circuit 135. Subsequent to that conversion, the DC voltage is fed into a voltage isolation circuit 140 that is configured to isolate the train voltage from other voltages in the TILTD 100. This isolation may be optional but is provided so as to reduce noise and cross talk effects on the detected data. Following output of the isolated voltage from circuit 140, the detected voltage data is buffered in the data buffering circuit 145 to improve signal integrity. Subsequently, the detected data is output to the data output component 115 as illustrated in FIG. 3.

Figure 3:
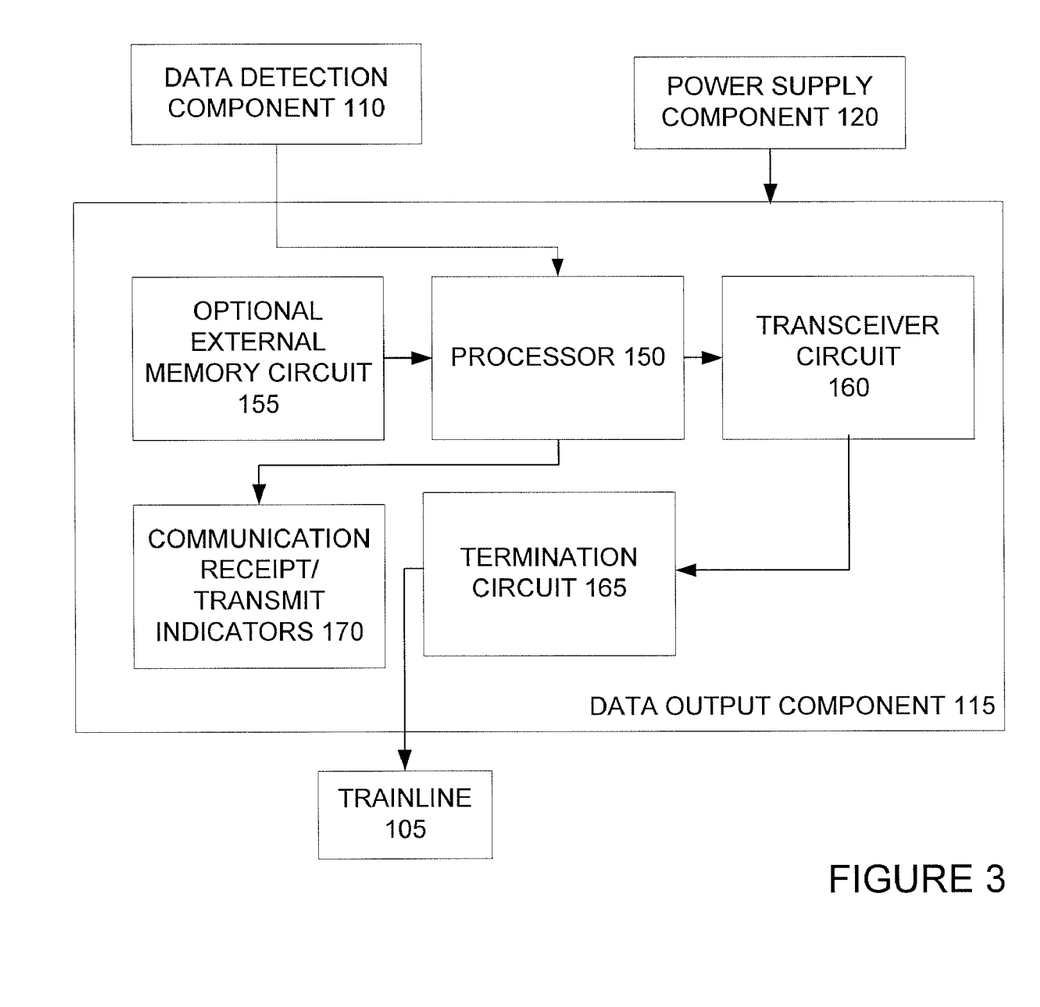
FIG. 3 is a further functional block diagram with additional detail regarding the data output components and provided to facilitate explanation of an illustrated embodiment of the trainline integrity locomotive test device.

FIG. 3 is a further functional block diagram with additional detail regarding the data output component 115 and is provided to facilitate explanation of the circuits included in the data output component 115. As shown in FIG. 3, the data output component 115 may be coupled to the power supply component 110 so as to receive operating power for the circuits included therein. Additionally, the data output component 115 may be coupled to the data detection component 110 so as to enable transmission of the detected data to the HEU via the trainline 105.

The data output component 115 may include, for example, a processor 150 configured to control activation of the communication receipt/transmit indicator circuit 170. In one potential implementation, these the circuit 170 may include Light Emitting Diodes (LEDs) associated with the receipt or transmission of data along the trainline 105. For example, daylight readable LED may be provided on the exterior of the housing of the TILTD 100 and activated to indicate that data is being received along the trainline 105 by the TILTD 100. Similarly, a daylight readable LED may be provided in the TILT 100 and activated to indicate that data is being transmitted by the TILTD 100 along the trainline 105. This conditional activation of the LEDs may be controlled based on the data detected by the data detection component 110 that is input to the processor 150. Accordingly, the processor 150 may perform operations based on software resident in an internal memory of the processor 150. Alternatively, if the processor 150 does not include internal memory, the software may be stored in an optional external memory circuit 155 that is coupled to and accessed by the processor 150. The processor 150 also outputs data to the transceiver circuit 160, which may be, for example, an Echelon LONWORKS.®. PLT-22 transceiver, if, for example, the communication network of the trainline 105 is based upon the Echelon Corporation's LonWorks.®. network technology.

The transceiver data output from the transceiver circuit 160 is fed through a termination circuit 165 that serves to couple the data output component 115 to the trainline 105. In one implementation, the termination may be a 50 Ohm termination circuit that serves to couple the transceiver data into the trainline 105.

Figure 4:
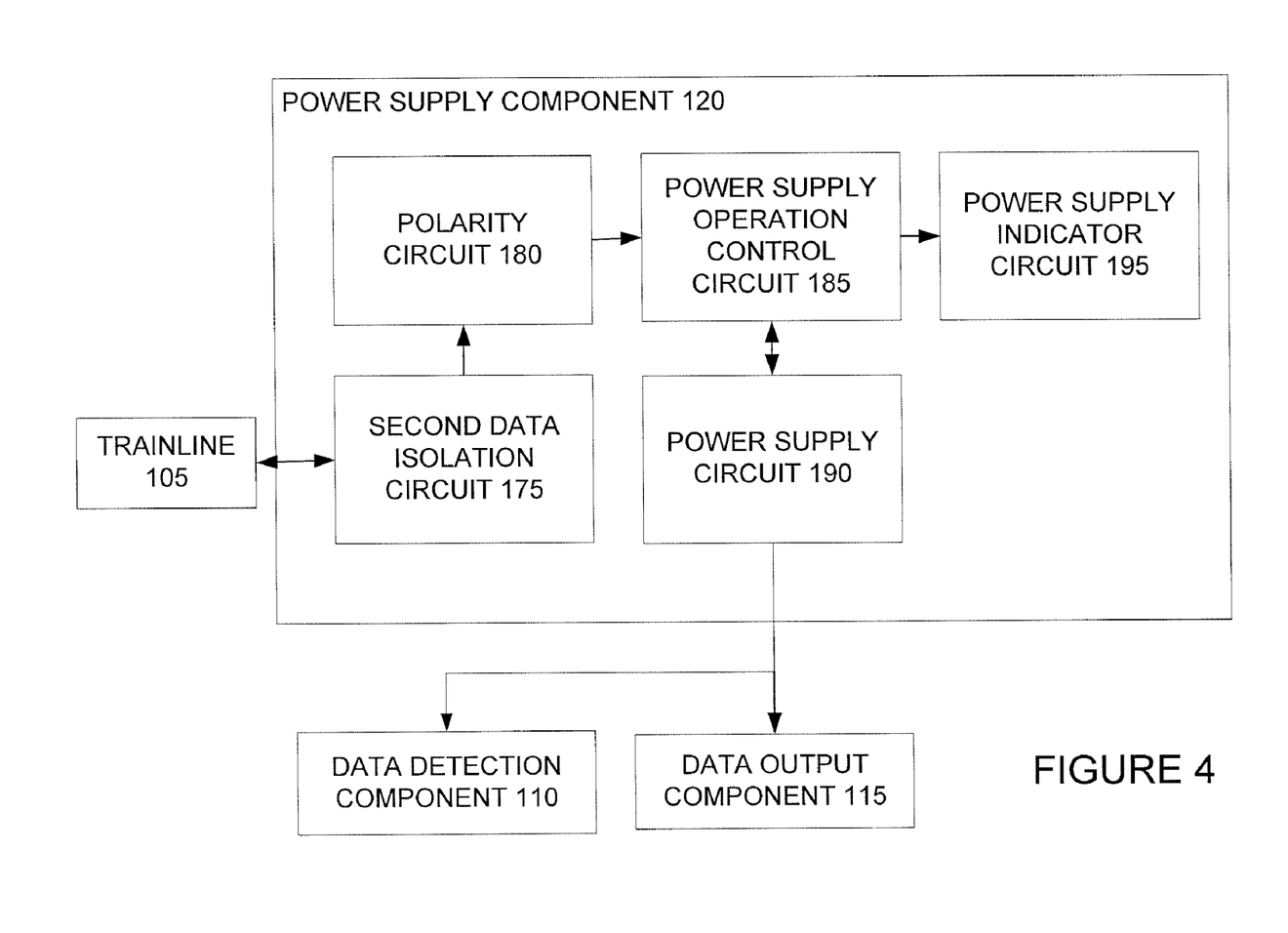
FIG. 4 is a further functional block diagram with additional detail regarding the power supply components and provided to facilitate explanation of an illustrated embodiment of the trainline integrity locomotive test device.

FIG. 4 is a further functional block diagram with additional detail regarding the power supply component 120 and provided to facilitate explanation of the circuits of that component 120 in accordance with an illustrated embodiment of the trainline integrity locomotive test device. As shown in FIG. 4, the power supply component 120, may include various circuits configured for particular purposes that cooperate together to provide operating power to the data detection component 110 and data output component 115. As mentioned above, the power supply component of the TILTD 100 does not include its own power supply and, instead, obtains power from the trainline 105, to which it is coupled. Accordingly, the power supply component 120 is coupled to the trainline 105 and includes a second data isolation circuit 175 that serves to electrically isolate the components included in the TILTD 100 from signals present on the trainline 105.

The power supply component 120 also includes a polarity circuit 180 configured to enable the TILTD 100 to be polarity insensitive. In operation, the TILTD 100 is meant to be easily coupled and decoupled from a trainline at various points; however, the polarity of the EOT connection changes each time another train car is attached to extend the train and associated trainline. Accordingly, incorporating a polarity circuit 180 enables the TILTD 100 to be coupled at various locations along a train and to obtain operating power without taking into consideration the polarity of the EOT connection; furthermore, incorporation of the polarity circuit 180 may also enable TILTD 100 to operate off of a trainline operating at 120 VAC.

The power supply component 120 also includes a power supply operation control circuit 185 that control operation of the power supply circuit 190 as well as operation of a corresponding power supply indicator circuit 195. As with the communication receipt/transmit indicator circuit 170, the circuit may include a daylight readable LED provided on the exterior of the housing of the TILT 100 and activated to indicate that the detected voltage of the trainline 105 is between 40 and 300 Volts AC or DC, which may be an acceptable level for performing electrical conductor diagnostics. This conditional activation of the LED may be controlled based on the data detected by the data detection component 110.

Figure 5:
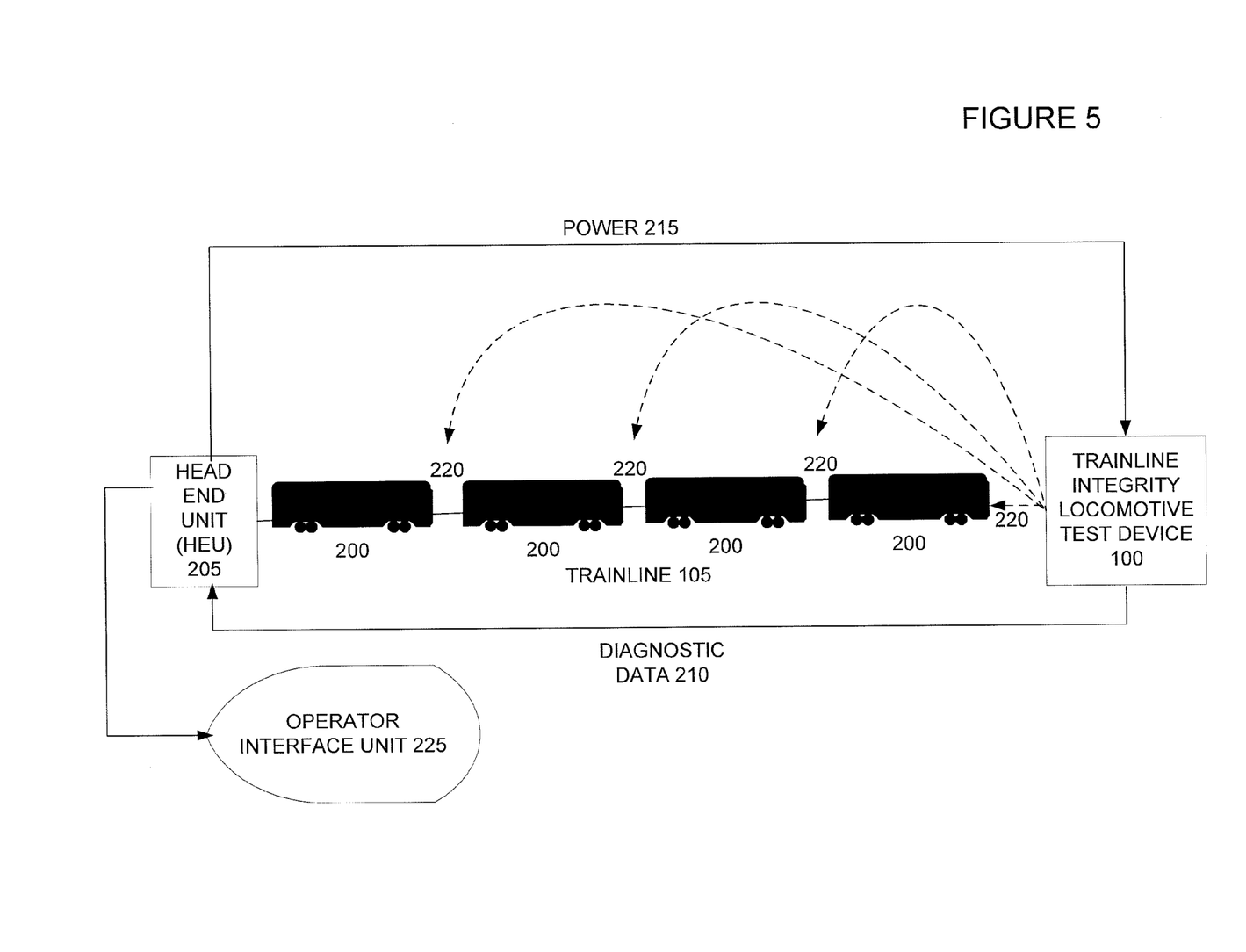
FIG. 5 is functional block diagram illustrating the interaction of a Head-End-Unit and the trainline integrity locomotive test device provided in various locations along a trainline.

FIG. 5 is functional block diagram illustrating the interaction of a HEU 205 and the TILTD 100 provided at various locations 220 along the trainline 105. As illustrated, diagnostic data 210 (including the data generated by the TILTD 100) may be transmitted along the trainline 105 to the HEU 205. Likewise, operating power 215 may be provided via the trainline 105 to the TILTD 100.

For the purposes of performing electrical conductor troubleshooting, the TILTD 100 may be provided at the end of a train comprised of train cars 200. If diagnostic data generated by the TILTD 100 indicates that there is a problem with the electrical connections along the trainline 105, the TILTD 100 may be moved to a next forward location 200 to aid in identifying where along the trainline 105 the electrical connection problem is located. This process may be performed iteratively until an electrical connection problem is located and evaluated. Thus, as part of diagnostic testing, a train car 200 is separated from the trainline 105 and the TILTD 100 is attached to the connector of the trainline 105. Subsequently, diagnostic analysis may be performed. If the analysis fails to identify the electrical problem, the TILTD 100 may be disconnected from the trainline connector and moved up to the next train car 200. Thus, a diagnostic methodology for testing integrity of a trainline for an electronically controlled pneumatic brake system may first include coupling a test device to a trainline and detecting a voltage level of the trainline by the test device. Subsequent to voltage detection, an indication of the trainline voltage level may be displayed at the test device. Simultaneous to such a display, the test device may generate both data indicating the detected trainline voltage level at the test device as well as an indication of an active communication link upon which the test device transmits trainline voltage level data. This indication, e.g., the heartbeat signal, may be configured to prevent electronically controlled pneumatic operation of the brake system via the trainline following receipt of the data indicating the trainline voltage level and the indication of the active communication link via the trainline at the HEU.

The TILTD 100 may be configured to transmit diagnostic data 210 to the HEU 205 in a format that is consistent with the format of data conventionally transmitted from an EOT device to the HEU. However, the TILTD 100 does not detect or transmit brake pipe pressure because the brake pipe may not be charged during the test or not at a functional pressure necessary for operation of the ECP brake system.

Accordingly, the TILTD 100 may be configured to generate a communications heartbeat signal that is transmitted in a data format so as to be displayed as the brake pipe pressure on the operator interface unit 225. In one implementation, the heartbeat signal may trigger display of an integer value that cycles one through five at half second intervals and repeats to provide an indication of data communication reliability and prevent operation of the braking system. As a result, the TILTD 100 enables operation of the HEU without requiring a corresponding EOT device at the opposite end of the trainline.

It should also be understood that, in at least one illustrated embodiment, the heartbeat signal cycles through integer values at such a rate, e.g., half second intervals, so as to effectively prevent the ECP brake system from operating.

In accordance with illustrated embodiments, a trainline integrity locomotive test device is configured so as to fit in a robust, light-weight, ergonomic enclosure. The trainline integrity locomotive test device is also configured to provide all of the conventionally provided EOT device functionality required for a single locomotive test. In addition, the trainline integrity locomotive test device is configured to provide the same functionality for troubleshooting an electrical problem in the trainline conductors.

In accordance with illustrated embodiments, the TILTD may be provided in a robust, light-weight, ergonomic enclosure. One example of an outer housing of the trainline integrity locomotive test device is provided in FIG. 6. As shown in that FIG. 6, the trainline integrity locomotive test device 100 may include an outer housing 230 that includes that may be made of, for example, a non-conductive, non-corrosive enclosure material resistant to Ultra Violet (UV), impact, moisture, mildew and extreme temperatures. When fully assembled, the TILTD 100 may weigh less than 10 pounds or approximately 4.5 kilograms and measure approximately 18×14×6 inches or approximately 0.5×0.33×0.15 meters. In an illustrated embodiment, the housing 230 may provide protection to assembly components included therein (see FIGS. 1-4) such that the TILTD 100 may function in extreme hot or cold temperatures, as well as surviving mechanical shock and vibration, as well as rain and high humidity.

Figure 6:
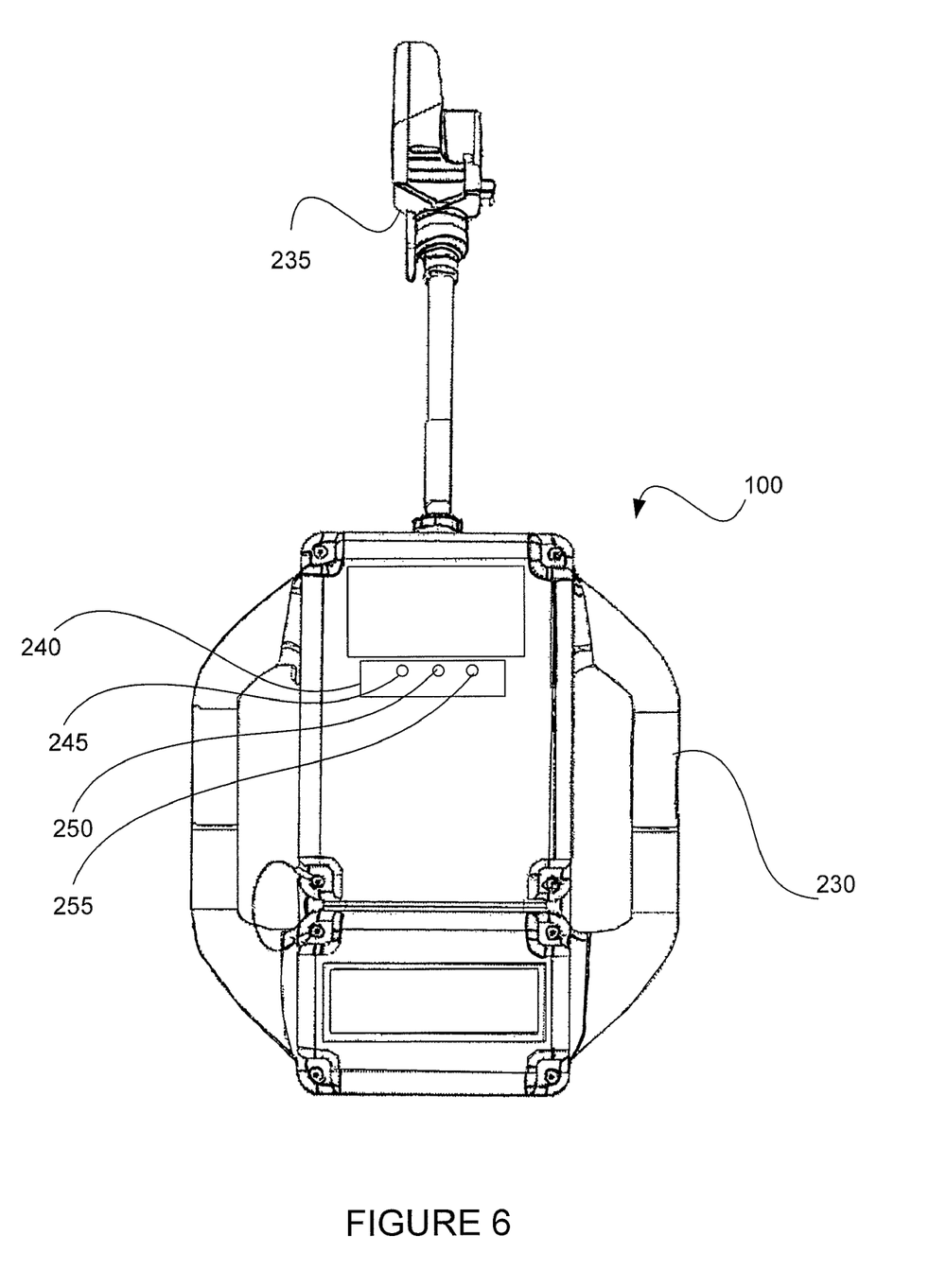
FIG. 6 illustrates one example of an outer appearance of a trainline integrity locomotive test device provided in accordance with an illustrated embodiment.

As shown in FIG. 6, a standard End-Of-Car (EOC) trainline connector 235 is coupled to a front end of the housing 230 so as to provide coupling of the TILTD 100 to a trainline for diagnostic analysis.

For improved durability, the TILTD 100 may include no switches or push buttons. Rather, as illustrated in FIG. 6, a user interface 240 may include only a plurality of sunlight readable LEDs 245, 250, 255 provided to indicate to personnel the status of the TILTD 100. Those LEDs correspond to the LEDS described above in connection with the data output component 115 (FIG. 3) and power supply component 120 (FIG. 4) of the TILTD 100.

Thus, illumination of LED 245 may indicate that trainline voltage is between 40 and 300 Volts AC or DC. Likewise, illumination of LED 250 may indicate that the TILTD 100 is transmitting data to the HEU. Further, illumination of LED 255 may indicate that the TILTD 100 is receiving a network message along the trainline.

Further adding to improved durability of the TILTD 100 is the incorporation of solid-state circuitry as illustrated in FIGS. 2-4. The solid-state component circuitry designs illustrated in those figures provide at least some conventional EOT device functionality by being configured to transmit standardized EOT beacons to the HEU. Thus, data transmitted to the HEU includes the actual trainline voltage detected by the TILTD 100, as well as the communications heartbeat signal provided as a pseudo-brake pipe pressure. Although the present invention has been described and illustrated in detail, it is to be clearly understood that this is done by way of illustration and example only and is not to be taken by way of limitation. Thus, while this invention has been described in conjunction with the specific embodiments outlined above, it is evident that many alternatives, modifications and variations will be apparent to those skilled in the art. Accordingly, the various embodiments of the invention, as set forth above, are intended to be illustrative, not limiting. Various changes may be made without departing from the scope of the invention. As a result, it will be apparent for those skilled in the art that the illustrative embodiments described are only examples and that various modifications can be made within the scope of the invention as defined in the appended claims.

The invention claimed is:

1. A trainline integrity locomotive test device for an electronically controlled pneumatic brake system, the device comprising:
    means for detecting a trainline voltage level;
    means for displaying an indication of the trainline voltage level;
    means for generating data indicating the detected trainline voltage level;
    means for generating an indication of an active communication link upon which the trainline voltage level data is transmitted; and
    means for transmitting the data indicating the trainline voltage level and data indicating the active communication link to a Head-End-Unit, wherein
    receipt of the data indicating the active communication link at the Head-End-Unit prevents the electronically controlled pneumatic operation of the brake system.

2. The test device of claim 1, wherein the active communication link indication includes a non-measured brake pipe pressure.

3. The test device of claim 2, wherein data included in the active communication link indication is displayed at an operator interface unit located at the Head-End-Unit as a replacement to brake pipe pressure display.

4. The test device of claim 1, wherein the means for transmitting is configured to transmit standardized End-Of-Train device beacons to a Head-End-Unit along the trainline.

5. The test device of claim 1, wherein the means for displaying an indication of the trainline voltage level includes a light emitting diode and associated circuitry configured to provide illumination of the light emitting diode if a detected trainline voltage level is between 40 and 300 Volts AC or DC.

6. The test device of claim 1, further comprising means for displaying an indication that the means for transmitting data is transmitting data.

7. The test device of claim 1, further comprising means for displaying an indication that the test device is receiving data.

8. The test device of claim 1, further comprising means for coupling the test device to a trainline that includes an End-Of-Car trainline connector coupled to a front end of a housing of the test device.

9. The test device of claim 1, wherein all means receive operating power via the trainline.

10. The test device of claim 1, wherein the means for detecting includes a first data isolation circuit configured to isolate trainline analog voltage data from communication data provided on the trainline.

11. The test device of claim 10, wherein the means for detecting also includes a circuit configured to scale the isolated trainline analog voltage.

12. The test device of claim 11, wherein the means for detecting further includes an analog to digital conversion circuit for converting the scaled analog trainline voltage to a digital trainline voltage.

13. The test device of claim 1, further comprising means for detecting a low impedance path between a conductor of the trainline and one or more of another trainline conductor and a chassis ground.

14. The test device of claim 1, further comprising a housing enclosing all of the means, the housing being composed of a non-conductive, non-corrosive enclosure material.

15. The test device of claim 1, wherein all means are implemented using only solid state devices.

16. A test method for testing integrity of a trainline for an electronically controlled pneumatic brake system, the method comprising:
    coupling a test device to a trainline;
    detecting a voltage level of the trainline by the test device;
    displaying, at the test device, an indication of the trainline voltage level;
    generating data indicating the detected trainline voltage level at the test device;
    generating an indication of an active communication link upon which the test device transmits trainline voltage level data; and
    transmitting the data indicating the trainline voltage level and data indicating the active communication link to a Head-End-Unit, wherein
    receipt of the data indicating the active communication link at the Head-End-Unit prevents the electronically controlled pneumatic operation of the brake system.

17. The test method of claim 16, wherein the indication of an active communication link includes a non-measured brake pipe pressure and the method further comprises displaying at an operator interface unit located at the Head-End-Unit data included in the active communication link indication as a measured brake pipe pressure replacement.

18. The test method of claim 17, further comprising displaying an indication that the test device is transmitting data on the trainline.

19. The test method of claim 17, further comprising displaying an indication that the test device is receiving data on the trainline.

* * * * *